(12) United States Patent
Mizuno et al.

(10) Patent No.: US 10,201,927 B2
(45) Date of Patent: Feb. 12, 2019

(54) IMPRINT APPARATUS, FOREIGN PARTICLE REMOVAL METHOD, AND METHOD OF MANUFACTURING ARTICLE

(71) Applicant: CANON KABUSHIKI KAISHA, Tokyo (JP)

(72) Inventors: Makoto Mizuno, Austin, TX (US); Shinichi Shudo, Utsunomiya (JP); Tsuyoshi Arai, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 700 days.

(21) Appl. No.: 14/561,576

(22) Filed: Dec. 5, 2014

(65) Prior Publication Data
US 2015/0174816 A1 Jun. 25, 2015

(30) Foreign Application Priority Data
Dec. 20, 2013 (JP) ................. 2013-264502

(51) Int. Cl.
  *B29C 59/02* (2006.01)
  *B29C 59/00* (2006.01)
  *G03F 7/00* (2006.01)
  *B29L 31/00* (2006.01)

(52) U.S. Cl.
  CPC .......... *B29C 59/026* (2013.01); *B29C 59/002* (2013.01); *G03F 7/0002* (2013.01); *B29L 2031/001* (2013.01)

(58) Field of Classification Search
  CPC .................. G03F 7/70908; G03F 7/70925
  See application file for complete search history.

(56) References Cited

U.S. PATENT DOCUMENTS 8,236,109 B2    8/2012  Moriya et al.
2007/0127001 A1*  6/2007  Van Der Hoeven ......... G03F 7/70341
                                         355/53

(Continued)

FOREIGN PATENT DOCUMENTS

CN   103135341 A   6/2013
JP   08181096 A   7/1996

(Continued)

OTHER PUBLICATIONS

Office Action issued in Korean Patent Application No. 10-2014-0179299 dated Jan. 24, 2017.

(Continued)

*Primary Examiner* — Galen H Hauth
(74) *Attorney, Agent, or Firm* — Rossi, Kimms & McDowell LLP

(57) ABSTRACT

The present invention provides an imprint apparatus which performs an imprint process of molding an imprint material on a substrate using a mold and forming a pattern on the substrate, the apparatus including a substrate chuck configured to hold the substrate, a protective plate configured to surround the substrate chuck, and a suction mechanism configured to suction at least a part of a gap between the substrate chuck and the protective plate, wherein while the suction mechanism suctions at least the part of the gap, the substrate chuck holds a plate which is different from the substrate on which the pattern is to be formed.

14 Claims, 4 Drawing Sheets

(56) References Cited

U.S. PATENT DOCUMENTS

| | | | | |
|---|---|---|---|---|
| 2008/0145773 A1* | 6/2008 | Wang | ................ | B29C 43/021 |
| | | | | 430/22 |
| 2009/0195761 A1* | 8/2009 | De Graaf | ............ | G03F 7/70341 |
| | | | | 355/30 |
| 2012/0156810 A1* | 6/2012 | Fukazawa | .......... | G01N 21/9501 |
| | | | | 438/16 |
| 2013/0182236 A1* | 7/2013 | De Schiffart | ......... | B29C 43/021 |
| | | | | 355/74 |
| 2014/0191441 A1 | 7/2014 | Mori | | |

FOREIGN PATENT DOCUMENTS

| | | | |
|---|---|---|---|
| JP | 2010147238 | A | 7/2010 |
| JP | 2010176080 | A | 8/2010 |
| JP | 2012049471 | A | 3/2012 |
| JP | 2012186390 | A | 9/2012 |
| JP | 2013069732 | A | 4/2013 |
| JP | 2013229475 | A | 11/2013 |
| WO | 2012063948 | A1 | 5/2012 |
| WO | 2013042350 | A1 | 3/2013 |

OTHER PUBLICATIONS

Office Action issued in Japanese Appln. No. 2013-264502 dated Sep. 19, 2017.
Office Action issued in Korean Appln. No. 10-2014-0179299 dated Jan. 4, 2018.
Office Action issued in Chinese Appln. No. 201410804774.X dated May 2, 2018. English translation provided.

* cited by examiner

MOVING DIRECTION OF
SUBSTRATE STAGE

IMPRINT APPARATUS, FOREIGN PARTICLE REMOVAL METHOD, AND METHOD OF MANUFACTURING ARTICLE

BACKGROUND OF THE INVENTION

Field of the Invention

The present invention relates to an imprint apparatus, a foreign particle removal method, and a method of manufacturing an article.

Description of the Related Art

The imprint technique can form a nanoscale fine pattern, and is coming into practical use as one of lithography techniques for volume production of magnetic storage media and semiconductor devices. An imprint apparatus which employs the imprint technique forms a pattern on a substrate such as a silicon wafer or a glass plate using a mold (die), as an original, on which a fine pattern (unevenness) has been formed. The imprint apparatus, for example, applies a light curable resin (for example, an ultraviolet-curing resin) on the substrate, and molds the resin using the mold. The resin is irradiated with light (for example, ultraviolet light) to be cured, and then the mold is separated from the cured resin, thereby forming the pattern of the resin on the substrate.

In the imprint apparatus, since the mold and (a resin on the) substrate are brought into direct contact with each other, if a foreign particle is present in a process space, a defect (transfer error) occurs in the pattern to be formed on the substrate, or the mold is damaged.

Japanese Patent Laid-Open Nos. 2010-176080 and 8-181096 propose techniques of removing foreign particles present on a substrate. Japanese Patent Laid-Open No. 2010-176080 discloses an arrangement of providing a suction mechanism which suctions a space on the substrate to remove the foreign particles present on the substrate. On the other hand, Japanese Patent Laid-Open No. 8-181096 discloses an arrangement of providing, in addition to the suction mechanism which suctions the space on the substrate, a blowing mechanism which blows a fluid (gas) onto the substrate to separate the foreign particles from the substrate easily.

In the conventional technique, however, the foreign particles separated from the substrate may adhere on the substrate or a substrate chuck again. Thus, the conventional technique is inadequate for a technique of removing foreign particles present in a process space. Especially in Japanese Patent Laid-Open No. 8-181096, the fluid is blown onto the substrate, resulting in scattering the foreign particles separated from the substrate in the process space.

In the imprint apparatus, the foreign particles tend to stay in a gap between the substrate chuck holding the substrate and a protective plate (flush plate) surrounding the substrate chuck. Since size reduction of the imprint apparatus is intended by restricting the movable range of the substrate stage, the degrees of freedom in the arrangement of the suction mechanism and the blowing mechanism in the apparatus are low. The conventional technique therefore cannot efficiently remove the foreign particles present in the gap between the substrate chuck and the protective plate.

SUMMARY OF THE INVENTION

The present invention provides a technique advantageous in removing a foreign particle present in a gap between a substrate chuck and a protective plate.

According to one aspect of the present invention, there is provided an imprint apparatus which performs an imprint process of molding an imprint material on a substrate using a mold and forming a pattern on the substrate, the apparatus including a substrate chuck configured to hold the substrate, a protective plate configured to surround the substrate chuck, and a suction mechanism configured to suction at least a part of a gap between the substrate chuck and the protective plate, wherein while the suction mechanism suctions at least the part of the gap, the substrate chuck holds a plate which is different from the substrate on which the pattern is to be formed.

Further aspects of the present invention will become apparent from the following description of exemplary embodiments with reference to the attached drawings.

DESCRIPTION OF THE EMBODIMENTS

Figure 1:
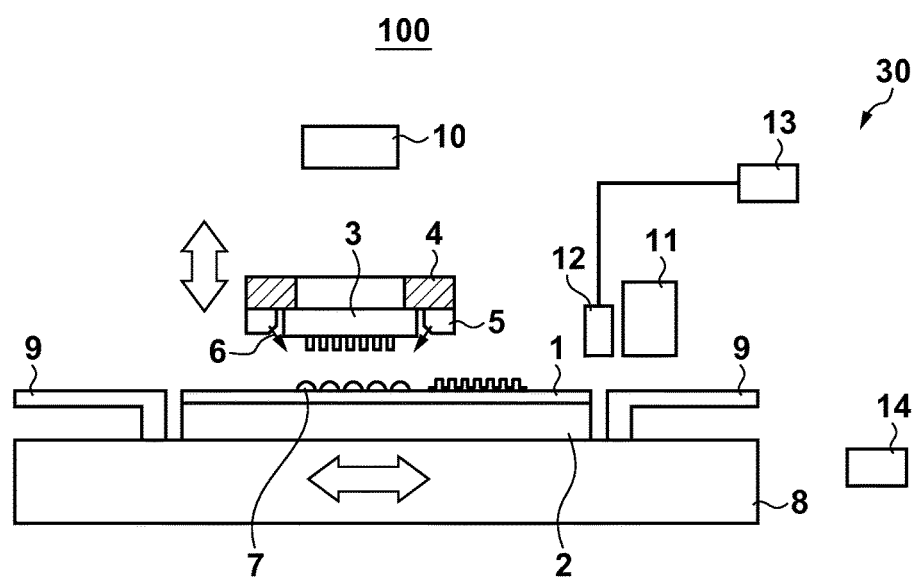
FIG. 1 is a schematic view showing the arrangement of an imprint apparatus according to an aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of an imprint apparatus 100 according to an aspect of the present invention. The imprint apparatus 100 is, for example, a lithography apparatus used for manufacturing a device such as a semiconductor device, and performs an imprint process of molding an imprint material (uncured resin) on a substrate using a mold (die) and forming a pattern on the substrate.

The imprint apparatus 100 includes, as shown in FIG. 1, a mold chuck 4, a gas supply mechanism 5, a substrate stage 8, an irradiation unit 10, a resin supply mechanism 11, a control unit 14, and a suction mechanism 30. The imprint apparatus 100 further includes respective members shown in FIGS. 2A to 2C, as will be described later.

The irradiation unit 10 includes a light source and an optical element, and emits light for curing a resin 7 on a substrate 1. As the light source of the irradiation unit 10, it is possible to use, for example, a high-pressure mercury lamp, various excimer lamps, an excimer laser, or a light-emitting diode. When using, for example, a photocuring resin cured by light irradiation as the resin 7, the light source of the irradiation unit 10 emits ultraviolet light. Note that light (wavelength thereof) emitted by the light source of the irradiation unit 10 is determined in accordance with the type of resin 7.

The substrate stage 8 is a movable stage which holds the substrate 1 to which the resin 7 is supplied (applied) via a substrate chuck 2. The substrate chuck 2 holds the substrate 1 by a vacuum suction force or an electrostatic force. The position of the substrate stage 8 is measured by a measurement device such as a laser interferometer or a linear encoder. A protective plate (flush plate) 9 is arranged on the substrate stage 8 to surround the substrate chuck 2. The protective plate 9 makes the surface of the substrate 1 held by the substrate chuck 2 and a region outside the substrate 1 flush with each other.

A mold 3 has an unevenness pattern corresponding to a pattern that should be formed on the substrate 1, and held by the mold chuck 4. The mold chuck 4 holds the mold 3 by the vacuum suction force or the electrostatic force, and is arranged on a mold stage. A hole which passes light from the irradiation unit 10 is formed in the mold chuck 4 so that the resin 7 on the substrate 1 can be irradiated with light through the mold 3.

The resin supply mechanism 11 includes a dispenser which forms droplets of the uncured resin and discharges the droplets, and supplies the resin 7 on the substrate 1. For example, by moving the substrate stage 8 while supplying the resin 7 by the resin supply mechanism 11, it is possible to apply the resin on the substrate 1.

The gas supply mechanism 5 is arranged in the vicinity of the mold 3, supplies a special fluid (special gas) to a space between the mold 3 and the substrate 1, and purges the space between the mold 3 and the substrate 1 with a special gas 6. Carbon dioxide, helium, nitrogen, carbon, hydrogen, xenon, or the like is used as the special gas 6.

The suction mechanism 30 includes a nozzle 12 and a suction pump 13 connected to the nozzle 12, and suctions at least a part of the gap between the substrate chuck 2 and the protective plate 9. In this embodiment, the suction mechanism 30 is formed to position the nozzle 12 above the gap between the substrate chuck 2 and the protective plate 9. The suction mechanism 30 may be configured, however, to suction the gap between the substrate chuck 2 and the protective plate 9 from a substrate stage side.

A control unit 14 includes a CPU and a memory, and controls the entire imprint apparatus 100. The control unit 14 controls the respective units of the imprint apparatus 100 to perform an imprint process of forming a pattern on the substrate. Moreover, the control unit 14 controls the respective units of the imprint apparatus 100 to perform a maintenance process of the imprint apparatus 100 such as a foreign particle removal process of removing a foreign particle from the imprint apparatus 100.

Figure 2A:
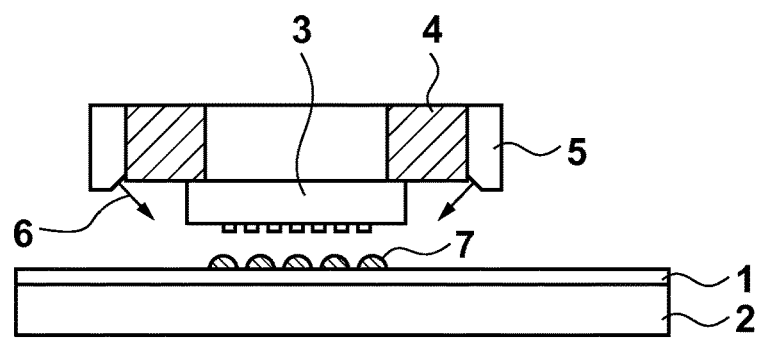
FIGS. 2A to 2C are views for explaining an imprint process.
Figure 2B:
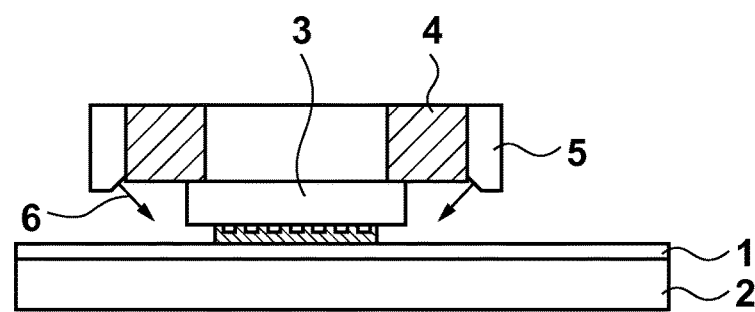
Figure 2C:
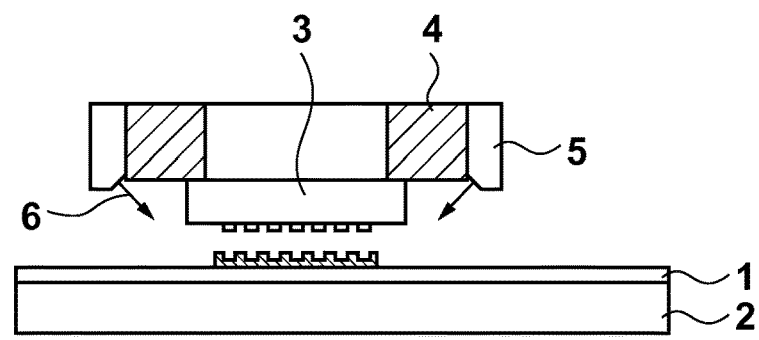

An imprint process in the imprint apparatus 100 will be described with reference to FIGS. 2A to 2C. First, as shown in FIG. 2A, the resin supply mechanism 11 supplies the resin 7 onto the substrate 1. Next, as shown in FIG. 2B, the mold 3 is pressed against the resin 7 on the substrate 1 (the mold 3 and the resin 7 are brought into contact with each other). By pressing the mold 3 against the resin 7, the resin 7 flows along the unevenness pattern of the mold 3 and fill the unevenness pattern. While the mold 3 and the resin 7 are in contact with each other, the resin 7 on the substrate 1 is irradiated with light from the irradiation unit 10 via the mold 3, and then cured. Then, as shown in FIG. 2C, the mold 3 is separated (released) from the cured resin 7 on the substrate 1. Accordingly, the pattern of the resin 7 corresponding to the unevenness pattern of the mold 3 is formed on the substrate 1.

In this embodiment, operations of pressing the mold 3 against the resin 7 on the substrate 1 and separating the mold 3 from the resin 7 are implemented by moving the mold 3 (mold stage) in a vertical direction. The operations of pressing the mold 3 against the resin 7 on the substrate 1 and separating the mold 3 from the resin 7 may be implemented, however, by moving the substrate 1 (substrate stage 8) in the vertical direction or moving both the mold 3 and the substrate 1 in the vertical direction.

When pressing the mold 3 against the resin 7, the unevenness pattern of the mold 3 needs to be filled with the resin 7 completely. If the resin 7 is cured in a state in which a bubble such as air between the mold 3 and the substrate 1 is trapped by the resin 7, a defect occurs in the pattern of the resin 7 to be formed on the substrate 1, thereby causing a defect in a semiconductor device. In order to satisfactorily fill the entire unevenness pattern of the mold 3 with the resin 7, it is preferable to purge the space between the mold 3 and the substrate 1 with the special gas 6. For this reason, in this embodiment, the gas supply mechanism 5 supplies the special gas 6 to the space between the mold 3 and the substrate 1.

The protective plate 9 is arranged on the substrate stage 8 as described above in order to keep the high concentration of the special gas 6 in the space between the mold 3 and the substrate 1. If the substrate stage 8 is moved immediately below the resin supply mechanism 11 in order to supply the resin 7 to a shot region serving as a target for the imprint process of the substrate 1, the substrate 1 may be shifted from the position under the mold 3. In this case, the concentration of the special gas 6 in the space between the mold 3 and the substrate 1 decreases greatly. To prevent this, the protective plate 9 is arranged so that the region outside the substrate 1 can keep almost the same height as the substrate 1 when supplying the resin 7 to an arbitrary shot region on the substrate 1 (any position on the substrate 1). This makes it possible to always keep the high concentration of the special gas 6 in the space between the mold 3 and the substrate 1.

Since each of the substrate 1 and the substrate chuck 2 generally has a circular shape, the protective plate 9 is made of a ring-shaped plate member having a hole slightly larger than the substrate 1 and the substrate chuck 2. Therefore, as shown in FIG. 1, foreign particles may adhere to the gap between the substrate chuck 2 and the protective plate 9, and be diffused by the operation (movement) of the substrate stage 8, resulting in the adhesion of the foreign particles onto the substrate 1.

In the imprint apparatus 100 which forms a nanoscale pattern on the substrate 1, if the foreign particle is present on (adhere onto) the substrate 1, a defect occurs in the pattern on the resin 7 to be formed on the substrate 1 or the mold 3 is damaged when pressed against the resin 7. To prevent this, in this embodiment, the suction mechanism 30 suctions at least the part of the gap between the substrate chuck 2 and the protective plate 9, thereby removing the foreign particle present in the gap between the substrate chuck 2 and the protective plate 9 (that is, performing the foreign particle removal process).

Figure 3:
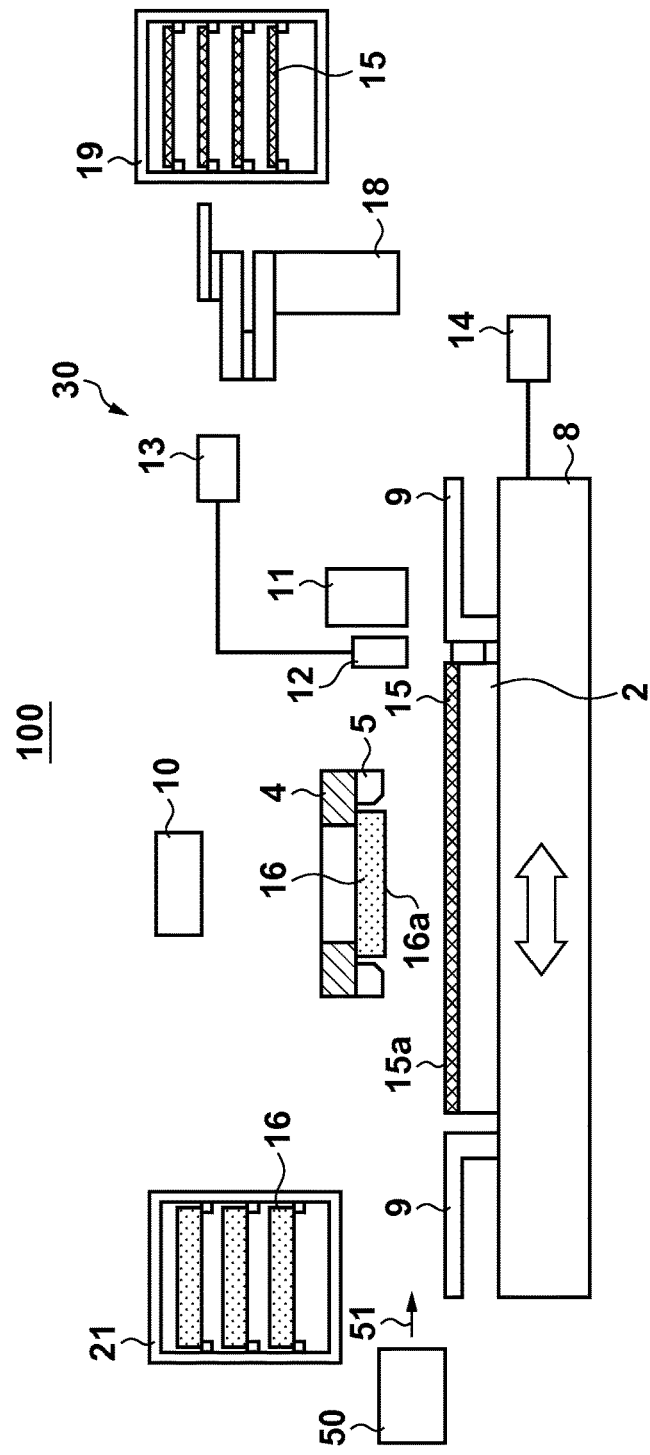
FIG. 3 is a view showing the state of the imprint apparatus at the time of the operation of a suction mechanism.

FIG. 3 is a view showing the state of the imprint apparatus 100 at the time of the operation of the suction mechanism 30 (that is, while the suction mechanism 30 suctions at least the part of the gap between the substrate chuck 2 and the protective plate 9). While the suction mechanism 30 suctions at least the part of the gap between the substrate chuck 2 and the protective plate 9, as shown in FIG. 3, the substrate chuck 2 holds a maintenance substrate (plate) 15 which is different from the substrate 1 on which the pattern is to be formed. This makes it possible to prevent the foreign particles that the suction mechanism 30 could not suction from adhering onto the substrate chuck 2 and the substrate 1 even if the foreign particles are diffused from the gap between the substrate chuck 2 and the protective plate 9. A trap surface 15a including a rough surface or an adhesive surface for trapping the foreign particles is formed on the surface of the maintenance substrate 15. This makes it possible to restrain the foreign particles adhering onto the maintenance substrate 15 from being diffused inside the imprint apparatus 100 again.

The imprint apparatus 100 generally includes a stocker 19 which stocks management substrates used for maintenance of keeping the apparatus state of the imprint apparatus 100 optimal. In this embodiment, the stocker 19 stocks the maintenance substrate 15 (functions as the first stocker) in addition to plural types of management substrates such as a substrate for measuring the flatness of the substrate chuck 2 and a substrate for removing the foreign particles adhering onto the substrate chuck 2. The imprint apparatus 100 further includes a conveyance system (first conveyance system) 18 which conveys, between the stocker 19 and the substrate chuck 2, the maintenance substrate 15 and the management substrates stocked in the stocker 19.

Likewise, while the suction mechanism 30 suctions at least the part of the gap between the substrate chuck 2 and the protective plate 9, as shown in FIG. 3, the mold chuck 4 preferably holds a dummy mold 16 which is different from the mold 3. This makes it possible to prevent the foreign particles that the suction mechanism 30 could not suction from adhering onto the mold chuck 4 and the mold 3 even if the foreign particles are diffused from the gap between the substrate chuck 2 and the protective plate 9. A trap surface 16a including a rough surface or an adhesive surface for trapping the foreign particles is formed on the surface of the dummy mold 16. This makes it possible to restrain the foreign particles adhering onto the dummy mold 16 from being diffused inside the imprint apparatus 100 again.

The imprint apparatus 100 generally includes a stocker 21 which stocks managements mold used for maintenance of keeping the apparatus state of the imprint apparatus 100 optimal. In this embodiment, the stocker 21 stocks the dummy molds 16 (functions as the second stocker) in addition to plural types of management molds. The conveyance system 18 conveys, between the stocker 21 and the mold chuck 4, the dummy molds 16 and the management molds stocked in the stocker 21 (functions as the second conveyance system). However, a dedicated conveyance system designed for conveying the dummy molds 16 and the management molds stocked in the stocker 21 between the stocker 21 and the mold chuck 4 may be provided.

In the imprint apparatus 100, the nozzle 12 which forms a part of the suction mechanism 30 is a nozzle capable of suction in a vacuum. The nozzle 12 is preferably arranged close to the gap between the substrate chuck 2 and the protective plate 9 in order to improve a suction effect by the nozzle 12. Alternatively, by providing a moving mechanism which moves the nozzle 12 in a direction perpendicular to the holding surface of the substrate chuck 2, the nozzle 12 may be arranged close to the gap between the substrate chuck 2 and the protective plate 9 (on the substrate stage side) when removing the foreign particle present in the gap between the substrate chuck 2 and the protective plate 9.

Consider a case in which the suction mechanism 30 is formed such that the nozzle 12 suctions a part of the gap between the substrate chuck 2 and the protective plate 9 within a surface parallel to the holding surface of the substrate chuck 2. In this case, the substrate stage 8 is moved, during the operation of the suction mechanism 30, to position all the regions in the gap between the substrate chuck 2 and the protective plate 9 under the nozzle 12 successively within the surface parallel to the holding surface of the substrate chuck 2. For example, since the gap between the substrate chuck 2 and the protective plate 9 is generally an arc-shaped groove, the substrate stage 8 is moved along an arc to always position the gap between the substrate chuck 2 and the protective plate 9 under the nozzle 12.

Alternatively, the suction mechanism 30 may be formed such that the nozzle 12 suctions all the regions in the gap between the substrate chuck 2 and the protective plate 9 within the surface parallel to the holding surface of the substrate chuck 2. In this case, the substrate stage 8 need not be moved during the operation of the suction mechanism 30.

The foreign particles may adhere to not only the gap between the substrate chuck 2 and the protective plate 9 but also various portions on the substrate stage 8 and the substrate chuck 2. The suction mechanism 30 can also remove the foreign particles adhering onto the substrate stage 8. For example, since the peripheral portion of the substrate 1 which has undergone a process easily become dirty, the foreign particles may adhere onto the substrate chuck 2 via the substrate 1. In this case, it is preferable to form the maintenance substrate 15 in a size smaller than the holding surface of the substrate chuck 2 and suction, by the suction mechanism 30, a holding surface exposed when the substrate chuck 2 holds the maintenance substrate 15. A sensor or the like is arranged in the protective plate 9, and the foreign particles easily adhere to the peripheral portion thereof as well. The suction mechanism 30 can also be used when removing the foreign particles adhered to the protective plate 9.

Figure 4:
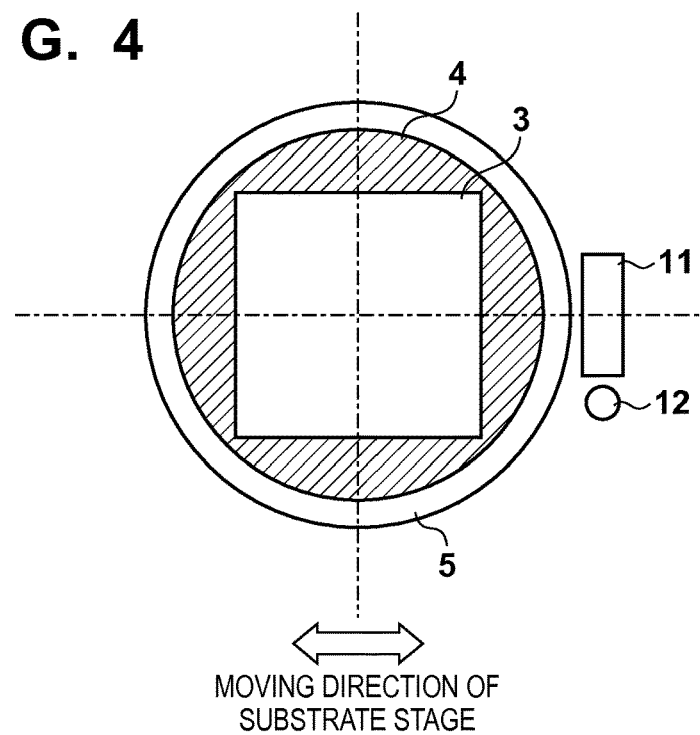
FIG. 4 is a view showing a positional relationship among a mold, a resin supply mechanism, and the suction mechanism.

When the imprint apparatus 100 supplies the resin 7 onto the substrate 1 every shot region, the resin supply mechanism 11 is generally arranged near the mold 3 to minimize the movable range of the substrate stage 8. FIG. 1 illustrates the suction mechanism 30 (nozzle 12) to be arranged between the mold 3 and the resin supply mechanism 11 to simplify the arrangement of the imprint apparatus 100. In practice, however, the resin supply mechanism 11 is preferably arranged in a position closest to the mold 3, as described above. Therefore, as shown in FIG. 4, the suction mechanism 30 is preferably arranged such that the distance between the mold 3 and the suction mechanism 30 becomes equal to the distance between the mold 3 and the resin supply mechanism 11. FIG. 4 is a view showing a positional relationship among the mold 3, the resin supply mechanism 11, and the suction mechanism 30. As shown in FIG. 4, the suction mechanism 30 is formed such that the distance between the mold 3 and the resin supply mechanism 11 and the distance between the mold 3 and the nozzle 12 become almost equal to each other relative to a direction in which the substrate stage 8 moves when supplying the resin 7 on the substrate 1. The suction mechanism 30 is also formed to position the nozzle 12 in a position close to the resin supply mechanism 11 relative to a position orthogonal to the moving direction of the substrate stage 8. This makes it possible to minimize the movable range of the substrate stage 8.

Figure 5:
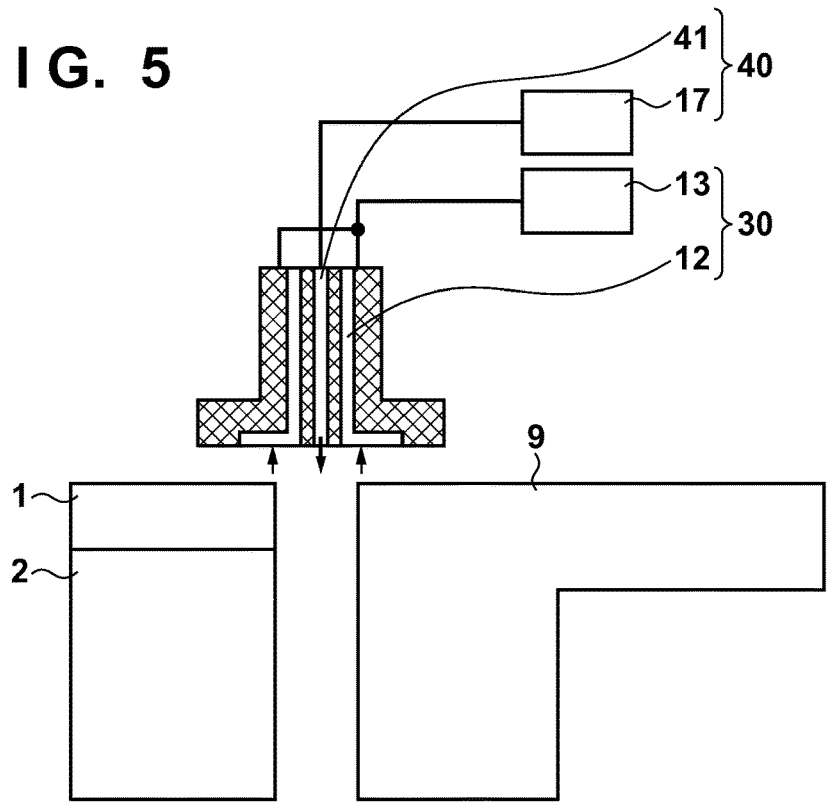
FIG. 5 is a view showing an example of the arrangement of a blowing mechanism which blows a gas into a gap between a substrate chuck and a protective plate.

As shown in FIG. 5, a blowing mechanism 40 which blows a gas into the gap between the substrate chuck 2 and the protective plate 9 may be provided in the nozzle 12. The blowing mechanism 40 includes a blowing nozzle 41 and a regulator 17. A gas (for example, compressed clean air) adjusted to an optimal flow rate by the regulator 17 is blown into the gap between the substrate chuck 2 and the protective plate 9 through the blowing nozzle 41. In this embodiment, while the blowing mechanism 40 blows the gas into the gap between the substrate chuck 2 and the protective plate 9, the suction mechanism 30 suctions at least the part of the gap between the substrate chuck 2 and the protective plate 9. This makes it possible to separate the foreign particle adhered to the gap between the substrate chuck 2 and the protective plate 9, thereby removing the foreign particles present in the gap between the substrate chuck 2 and the protective plate 9 more effectively.

Also, as described above, air conditioning of the process space is generally performed with clean air through a filter in the imprint apparatus. As shown in FIG. 3, the imprint apparatus 100 includes an air conditioner 50 which supplies clean air (gas) 51 to the process space including a space between the mold 3 (dummy mold 16) and the substrate chuck 2. In this embodiment, while the air conditioner 50 supplies the clean air 51 in a direction from the center of the maintenance substrate 15 toward a portion suctioned by the suction mechanism 30, the suction mechanism 30 suctions at least the part of the gap between the substrate chuck 2 and the protective plate 9. This makes it possible to prevent the diffusion of the foreign particles present in the gap between the substrate chuck 2 and the protective plate 9 and remove the foreign particles efficiently. Note that in this embodiment, the air conditioner 50 supplies the gas to the process space so that the flow rate of the gas flowing into the process space while the suction mechanism 30 operates is higher than that while performing the imprint process. This makes it possible to remove the foreign particles present in the gap between the substrate chuck 2 and the protective plate 9 more efficiently.

The imprint apparatus 100 according to this embodiment can remove, by the suction mechanism 30, the foreign particles present in the gap between the substrate chuck 2 and the protective plate 9. The imprint apparatus 100 can therefore prevent the occurrence of the defect in the pattern of the resin 7 to be formed on the substrate 1 or damage to the mold 3 to be caused when the mold 3 is pressed against the resin 7. Hence, the imprint apparatus 100 can provide an article such as a high-quality semiconductor device economically with high throughput.

A method of manufacturing a device (the semiconductor device, a magnetic storage media, a liquid crystal display element, or the like) serving as the article will be described. The manufacturing method includes a step of forming the pattern on the substrate (a wafer, a glass plate, a film-like substrate, or the like) using the imprint apparatus 100. The manufacturing method further includes a step of processing the substrate on which the pattern has been formed. The processing step can include a step of removing the residual film of the pattern. The processing step can also include another known step such as a step of etching the substrate using the pattern as a mask. The method of manufacturing the article according to this embodiment is advantageous in at least one of the performance, the quality, the productivity, and the production cost of the article, as compared to conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-264502 filed Dec. 20, 2013, which is hereby incorporated by reference herein in its entirety.

What is claimed is:

1. An imprint apparatus which performs an imprint process of molding an imprint material on a substrate using a mold and forming a pattern on the substrate, the apparatus comprising:
    a substrate chuck configured to hold a substrate;
    a first plate configured to surround the substrate chuck;
    a suction mechanism including a nozzle arranged to face a gap between the substrate chuck and the first plate, configured to suction a gas contained in the gap through the nozzle; and
    a first stocker which stocks a second plate which is different from the substrate on which a pattern is formed,
    wherein the substrate chuck is configured to hold the second plate while the suction mechanism suctions the gas contained in the gap,
    wherein the second plate prevents a foreign particle, which is diffused from the gap by suctioning the gas contained in the gap by the suction mechanism, from adhering onto the substrate chuck.

2. The apparatus according to claim 1, further comprising a mold chuck configured to hold a mold,
    wherein the mold chuck is configured to hold a dummy mold which is different from a mold used to pattern the substrate, the dummy mold including an unevenness pattern corresponding to a pattern that should be formed on the substrate.

3. The apparatus according to claim 1, wherein a trap surface including a rough surface or an adhesive surface for trapping a foreign particle is formed on a surface of the second plate.

4. The apparatus according to claim 2, wherein a trap surface including a rough surface or an adhesive surface for trapping a foreign particle is formed on a surface of the dummy mold.

5. An imprint apparatus which performs an imprint process of molding an imprint material on a substrate using a mold and forming a pattern on the substrate, the apparatus comprising:
    a substrate chuck configured to hold a substrate;
    a first plate configured to surround the substrate chuck;
    a suction mechanism including a nozzle arranged to face a gap between the substrate chuck and the first plate, configured to suction a gas contained in the gap through the nozzle; and
    a first stocker which stocks a second plate which is different from the substrate on which a pattern is formed, and
    a blowing mechanism configured to blow a gas into the gap,
    wherein the suction mechanism is configured to suction the gas contained in the gap while the gas is blowing into the gap, and
    wherein the substrate chuck is configured to hold the second plate while the suction mechanism suctions the gas contained in the gap.

6. The apparatus according to claim 1, further comprising an air conditioner configured to supply a gas to a space between the mold and the substrate chuck, wherein the suction mechanism is configured to suction the gas contained in the gap while the air conditioner supplies the gas in a direction from a center of the second plate toward a portion in the gap.

7. The apparatus according to claim 6, wherein the air conditioner is configured to supply the gas to the space at a flow rate that is higher than a flow rate during an imprint process.

8. The apparatus according to claim 1, further comprising a movable substrate stage configured to hold the substrate chuck and the first plate,
   wherein the suction mechanism is arranged above the gap and the nozzle configured to suction the gas contained in some regions in the gap within a surface parallel to a holding surface of the substrate chuck, and
   wherein the substrate stage is configured to move to position all regions in the gap under the nozzle successively within the surface parallel to the holding surface of the substrate chuck while the suction mechanism suctions the gas contained in the gap.

9. The apparatus according to claim 1, wherein the suction mechanism is arranged above the gap and the nozzle is configured to suction the gas contained in all regions in the gap within a surface parallel to a holding surface of the substrate chuck.

10. The apparatus according to claim 1, further comprising a supply mechanism configured to supply the imprint material onto the substrate,
   wherein the suction mechanism is configured such that a distance between the mold and the suction mechanism is equal to a distance between the mold and the supply mechanism.

11. The apparatus according to claim 1, further comprising
   a first conveyance system configured to convey the second plate between the first stocker and the substrate chuck.

12. The apparatus according to claim 2, further comprising
   a second stocker configured to stock the dummy mold; and
   a second conveyance system configured to convey the dummy mold stocked in the second stocker between the second stocker and the mold chuck.

13. A method of manufacturing an article, the method comprising:
   forming a pattern on a substrate using an imprint apparatus; and
   processing the substrate on which the pattern has been formed,
   wherein the imprint apparatus performs an imprint process of molding an imprint material on the substrate using a mold and forming the pattern on the substrate, and includes:
   a substrate chuck configured to hold the substrate;
   a first plate configured to surround the substrate chuck;
   a suction mechanism including a nozzle arranged to face a gap between the substrate chuck and the first plate, configured to suction a gas contained in the gap through the nozzle, and
   a first stocker which stocks a second plate which is different from the substrate on which a pattern is formed,
   wherein the substrate chuck is configured to hold the second plate while the suction mechanism suctions the gas contained in the gap, and
   wherein the first plate prevents a foreign particle, which is diffused from the gap by suctioning the gas contained in the gap by the suction mechanism, from adhering onto the substrate chuck.

14. An imprint apparatus which performs an imprint process of molding an imprint material on a substrate using a mold and forming a pattern on the substrate, the apparatus comprising:
   a substrate chuck configured to hold a substrate;
   a first plate configured to surround the substrate chuck;
   a suction mechanism including a nozzle arranged to face a gap between the substrate chuck and the first plate, configured to suction a gas contained in the gap through the nozzle; and
   a first stocker which stocks a second plate which is different from the substrate on which a pattern is formed,
   wherein the substrate chuck is configured to hold the second plate while the suction mechanism suctions the gas contained in the gap, and
   wherein the surface of a substrate held by the substrate chuck and an upper surface of the first plate are flush with each other.

* * * * *